(12) United States Patent
Kloster et al.

(10) Patent No.: US 7,238,604 B2
(45) Date of Patent: Jul. 3, 2007

(54) FORMING THIN HARD MASK OVER AIR GAP OR POROUS DIELECTRIC

(75) Inventors: Grant M. Kloster, Lake Oswego, OR (US); Kevin P. O'Brien, Portland, OR (US); David H. Gracias, Portland, OR (US); Hyun-Mog Park, Beaverton, OR (US); Vijayakumar S. Ramachandrarao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 10/422,432

(22) Filed: Apr. 24, 2003

(65) Prior Publication Data

US 2004/0214427 A1    Oct. 28, 2004

(51) Int. Cl.
*H01L 21/4763* (2006.01)

(52) U.S. Cl. .............. 438/619; 438/597; 438/618; 438/637; 438/638; 257/E21.495

(58) Field of Classification Search ........... 438/411, 438/421–422, 597, 618–619, 637–640, 666, 438/763, 778, 780–782, 795, 798, 942, 948–950, 438/958
See application file for complete search history.

(56) References Cited

U.S. PATENT DOCUMENTS

| 5,103,288 | A | * | 4/1992 | Sakamoto et al. | 257/758 |
| 5,461,003 | A | * | 10/1995 | Havemann et al. | 438/666 |
| 5,880,030 | A | | 3/1999 | Fang et al. | 438/701 |
| 5,935,868 | A | | 8/1999 | Fang et al. | 438/692 |
| 5,960,316 | A | | 9/1999 | Bai | 438/633 |
| 6,083,825 | A | | 7/2000 | Lin et al. | 438/629 |
| 6,124,200 | A | | 9/2000 | Wang et al. | 438/624 |
| 6,162,722 | A | | 12/2000 | Hsu | 438/637 |
| 6,306,757 | B1 | | 10/2001 | Huang et al. | 438/634 |
| 6,365,971 | B1 | | 4/2002 | Bai | 257/758 |
| 6,451,712 | B1 | * | 9/2002 | Dalton et al. | 438/781 |
| 6,472,315 | B2 | | 10/2002 | Nguyen et al. | 438/637 |
| 6,492,732 | B2 | | 12/2002 | Lee et al. | 257/758 |
| 6,528,409 | B1 | * | 3/2003 | Lopatin et al. | 438/618 |
| 6,537,896 | B1 | * | 3/2003 | Catabay et al. | 438/474 |
| 6,562,732 | B2 | * | 5/2003 | Besling et al. | 438/780 |
| 6,815,329 | B2 | * | 11/2004 | Babich et al. | 438/619 |
| 6,930,056 | B1 | * | 8/2005 | Catabay et al. | 438/778 |
| 2002/0028575 | A1 | * | 3/2002 | Besling et al. | 438/638 |
| 2002/0140103 | A1 | * | 10/2002 | Kloster et al. | 257/767 |
| 2004/0063305 | A1 | * | 4/2004 | Kloster et al. | 438/619 |
| 2004/0087183 | A1 | * | 5/2004 | Goodner et al. | 438/781 |
| 2005/0037604 | A1 | * | 2/2005 | Babich et al. | 438/619 |

* cited by examiner

*Primary Examiner*—Michael Lebentritt
*Assistant Examiner*—Angel Roman
(74) *Attorney, Agent, or Firm*—Trop, Pruner & Hu, P.C.

(57) ABSTRACT

A thin hard mask is formed over a semiconductor substrate. The thin hard mask allows diffusion of a sacrificial material or pore-forming agent therethrough to form an underlying air gap or porous dielectric region. The thin hard mask may be a polymer or an initially porous material that may be later densified. The thin hard mask may be used to prevent etch steps used in forming an unlanded via from reaching layers below the hard mask.

26 Claims, 5 Drawing Sheets

FORMING THIN HARD MASK OVER AIR GAP OR POROUS DIELECTRIC

BACKGROUND

The present invention relates generally to the field of integrated circuit manufacturing, and more specifically, to forming hard mask layers over air gaps or porous interlayer dielectric materials on a semiconductor substrate.

Low dielectric constant (low-k) materials are increasingly needed for use as interlayer dielectrics (ILDs) in semiconductor devices, to reduce RC delay and improve device performance. As devices sizes continue to shrink, the dielectric constant of the material between metal lines must decrease to maintain the improvement. For example, some integrated circuit devices are expected to require dielectric materials with k<2 in the near future. To produce dielectric materials having such low dielectric constants, greater porosity is required, or air gaps may be created between the metal lines. However, unlanded via formation is difficult to integrate with air gaps or on top of porous dielectric layers because the etch process cannot be controlled sufficiently to prevent unwanted metal deposition in various areas of the device.

In semiconductor devices, vias connect different layers of metal lines or electrically conductive materials. An insulator or dielectric material may be formed between separate planes of conductive material around the vias and also within the trenches in the circuit pattern of a layer of conductive material.

In the past, vias usually have been formed as landed vias (i.e., the via rests entirely on a conductive layer) rather than unlanded vias (i.e., the via rests partially on a conductive layer and partially on an insulator). For example, unlanded vias may result from some misalignment of masks that are used to form the openings in dielectric layers. As packing density of integrated circuits increase, and device geometries decrease, very slight misalignment, lithography, or etch registration errors may result in unlanded vias. To avoid the risk of poor electrical connections or device failure, efforts have been made to exclude unlanded vias from design rules, or to specify increasingly restrictive alignment tolerances to prevent unlanded vias. However, unlanded vias cannot be eliminated completely if higher packing densities are to be achieved.

Thus, unlanded vias may be necessarily encountered in semiconductor processing as devices shrink and packing densities increase. One such process is a dual damascene process that involves forming both a via and a trench in a dielectric layer or interlayer dielectric. After the via and trench are etched, they may be filled with a conductive material such as copper to form a complete conductive layer of interconnects.

In some processes, such as dual damascene processes, hard mask layers have been added, at least in part to handle unlanded vias. For example, a hard mask layer may provide an etch stop, i.e., to block or prevent conductive material in an unlanded via, or dry or wet etch chemicals used to form an unlanded via, from breaking through and/or spilling into one or more underlying layers and cause irretrievable damage to those layers. The lower layers that may be adversely affected include air gap layers or low-k dielectric materials that may have significant porosity. If the air gaps or porous dielectric layers are not isolated from etching steps, subsequent processing may provide the unwanted result of filling that gap or layer with metal.

Materials that have been used to form such protective hard mask layers include silicon oxide, silicon nitride or silicon carbide. Not only are the hard masks intended to prevent the etching steps from damaging dielectric or air gap layers below unlanded vias, but they also should provide mechanical support to build layers over the Lard mask layer. However, the materials that have been used for hard mask layers generally have a dielectric constant (k) of at least 5.0. As a result, hard mask layers tend to increase the overall effective dielectric constant of the dielectric stack. Additionally, the etch selectivity of a silicon nitride or silicon carbide hard mask layer to a dielectric material such as carbon doped oxide (CDO) is only in the range of approximately 2:1 or 3:1 for manufacturable etch processes, so there is a risk that the etching steps could penetrate hard mask that is thin.

What is needed is a thin hard mask layer over an air gap or dielectric material, in which the thin hard mask has an etch selectivity to the dielectric material substantially greater than 2:1 or 3:1. A hard mask layer also is needed for use in dual damascene and other multilayer semiconductor processes, that will contribute to a lower $k_{eff}$ value, thereby reducing RC delay. A hard mask layer is needed that will allow diffusion of sacrificial material or pore-forming material therethrough to form air gaps or pores. A hard mask layer and method are needed that will allow use of unlanded vias and decrease the risk that etching steps could penetrate through to underlying layers. A hard mask layer is needed for semiconductor manufacturing process that will contribute to less restrictive, and therefore less costly, tolerances.

DETAILED DESCRIPTION

Set forth below is a description of embodiments of the present invention, presented in the context of a semiconductor device that includes copper containing dual damascene interconnects. The description is made with reference to FIGS. 1a-1j which illustrate cross-sections of structures that result after using certain steps according to certain embodiments of the invention. Although dual damascene interconnects are described, it will be understood that the present invention also may be used in the context of other semiconductor devices, including but not limited to single damascene processes, in which one or more hard mask layers may be formed immediately over and/or adjacent an air gap or dielectric layer.

Figure 1A:
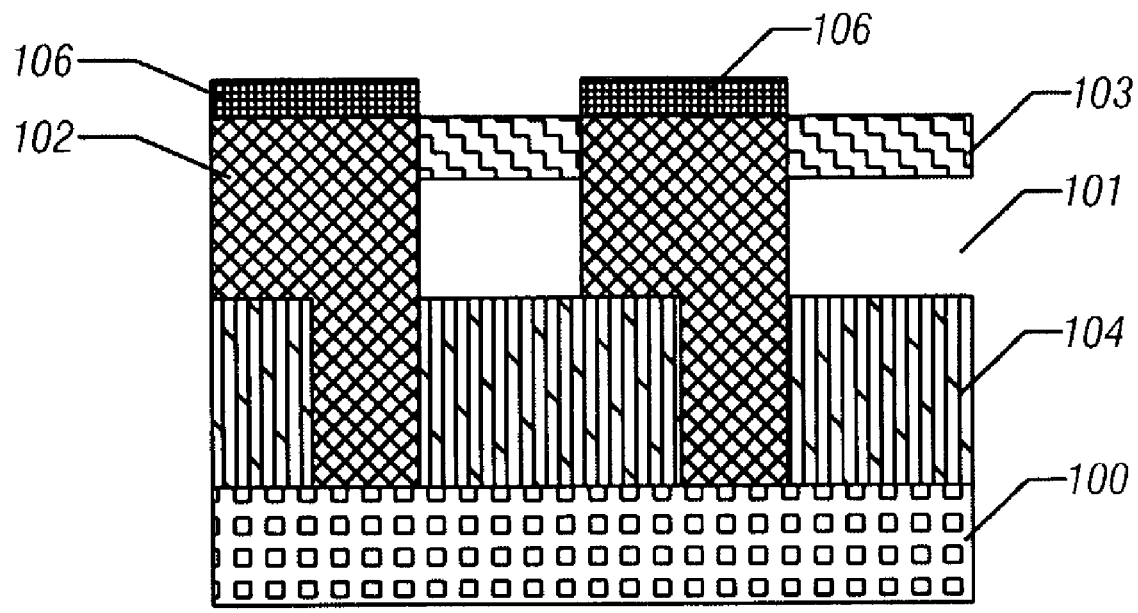
FIGS. 1a-1j illustrate cross-sections that reflect structures that may result after certain steps are used to make a copper containing dual damascene device following one embodiment of the present invention.

FIG. 1a shows substrate 100 which may be any surface including, for example, active and passive devices that are formed on a silicon wafer such as transistors, capacitors, resistors, diffused junctions, gate electrodes, local interconnects, etc. Although not shown in FIG. 1a, the substrate also may include one or more conductive layers or insulating layers (e.g., silicon dioxide, either undoped or doped with phosphorus (PSG) or boron and phosphorus (BPSG); silicon nitride; silicon oxynitride; or a polymer) that separate such active and passive devices from any conductive layer or layers that are formed on top of them.

Such conductive layers may comprise copper, and may be formed using a conventional copper electroplating process, in which a copper layer is formed on barrier and seed layers. A conductive layer or layers also may be made from other materials conventionally used to form conductive layers for integrated circuits. For example, conductive layers may be made from a copper alloy, aluminum or an aluminum alloy, such as an aluminum/copper alloy. Alternatively, they may be made from doped polysilicon silicide, e.g., a silicide comprising tungsten, titanium, nickel or cobalt. The substrate also may comprise a primary conductor made from an aluminum/copper alloy that is sandwiched between a relatively thin titanium layer located below it and a titanium, titanium nitride double layer above it.

Conductive layers in substrate 100 may be formed by a chemical vapor or physical deposition process, like those that are well known to those skilled in the art. If copper is used to make a conductive layer, a conventional copper electroplating process may be used. Conductive layers also may be formed from various other materials that can serve to conduct electricity within an integrated circuit. Although copper is preferred, the use of any other conducting material, which may be used to make an integrated circuit, falls within the spirit and scope of the present invention.

Substrate 100 also may include a barrier layer made from silicon nitride, silicon carbide or other materials such as titanium nitride or oxynitride, as is well known to those skilled in the art. When formed from silicon nitride, a chemical vapor deposition process may be used to form the barrier layer. A barrier layer may serve to prevent an unacceptable amount of copper, or other metal, from diffusing into other layers, and also may act as an etch stop to prevent subsequent via and trench etch steps from exposing an underlying conductive layer to subsequent cleaning steps. The barrier layer should be thick enough to perform its diffusion inhibition and etch stop functions, but not so thick that it adversely impacts. The overall dielectric characteristics resulting from the combination of the barrier layer and the dielectric layer overlying the barrier layer. The thickness of the barrier layer preferably should be less than about 10% of the thickness of the overlying dielectric layer, and preferably between about 100 and 500 angstroms thick.

In one embodiment, dielectric layer or interlayer dielectric (ILD) 104 is formed on the substrate. The ILD may have a dielectric constant lower than 3.9 which is the dielectric constant of silicon dioxide. For example, the dielectric layer may comprise plasma enhanced chemical vapor deposition (PECVD) silicon dioxide doped with carbon, having a dielectric constant of approximately 2.2 to 2.6. Other materials that may be used for dielectric layer 104 include materials that may insulate one conductive layer from another, and preferably those materials having dielectric constants below that of silicon dioxide, and most preferably materials with dielectric constants below about 3.0. For example, the dielectric layer may comprise fluorinated silicon dioxide or organic polymers selected from the group that includes polyimides, parylenes, polyartylethers, polynaphthalenes, and polyquinolines, or copolymers thereof. The dielectric layer preferably has a thickness of between about 2,000 and about 20,000 angstroms.

In one embodiment of the invention, layer 101 may be at least partially thermally decomposable material formed over dielectric layer 104. For example, layer 101 may be sacrificial material that is at least partially or completely thermally decomposable so that it may be subsequently removed to form an air gap adjacent and under the hard mask layer. Alternatively, in another embodiment, layer 101 may be a dielectric material that may include a porogen or other pore-forming agent embedded therein. In one embodiment, the porogen or other pore-forming agent may be at least partially thermally decomposable.

Hard mask layer 103 is formed over layer 101. It is contemplated that the hard mask layer may have a number of different embodiments, several of which will be described in more detail below.

In a first embodiment, hard mask layer 103 is made from a polymeric material. For example, a polymer hard mask layer may be an organic polymer including but not limited to polycarbonates, polysulfides, or polyetheretherketones (PEEK). Alternatively, the polymer hard mask layer may be a cross linked polymer, which may have greater thermal and or mechanical properties. In the first embodiment, various different polymers may be used for hard masks, those polymers having a wide range of different values for hardness, yield stress, crack resistance and abrasion resistance.

The polymer hard mask layer in the first embodiments may have a thickness in the range of about 20 nanometers to about 80 nanometers, and preferably less than about 50 nanometers. The polymer hard mask of this embodiment also may have a k-value of less than about 4.5. As a result, the polymer hard mask layer may help minimize or provide significant reduction in the overall $k_{eff}$ of the dielectric stack. Additionally, the hard mask layer should be thin enough to allow diffusion of at least some or all of the thermally decomposable and/or sacrificial material in layer 101 through it.

Polymers that may be used as a hard mask layer in this first embodiment also should have a high etch selectivity compared to ILD materials. For example, the etch selectivity of some polymers that may be used, compared to carbon-doped oxide (CDO), may be greater than about 15:1.

Polymer hard mask materials that are contemplated in this first embodiment should have glass transition or thermal decomposition temperatures greater than about 300 degrees C., and therefore can survive dual damascene processing without substantial degradation or decomposition. In general, polymeric materials for use as a hard mask layer should have thermal stability grease; than that of the material in layer 101, and/or greater than that of pore-forming agents in layer 101 or dielectric layer 104.

The polymer hard mask layer made in accordance with the first embodiment also should have permeability sufficient for diffusion of the thermally decomposable and/or sacrificial material therethrough, preferably at temperatures of about 300 degrees C. or higher. In general, suitable polymers should have sufficiently high free volume to allow diffusion of some or all of the sacrificial material in layer 101 through the hard mask, thus acting as membranes that allow diffusion of small gas molecules through them.

The polymer hard mask layer in the first embodiment also should be rigid enough to provide mechanical support necessary for overlying layers in dual damascene or similar multilayer semiconductor structures. For example, polymers such as polycarbonate, polyphenylene sulfide, and polyetheretherketone have a high yield stress and will resist sagging under a constant force of gravity. The polymer hard mask also should be resistant to sag, especially if the hard mask is included in air gap integration processes in which little or no mechanical support exists below the hard mask.

Polymers having a wide range of different indentation hardness may be used as a hard mask layer in this first embodiment. For example, polymers such as polynorbornene, which has an indentation hardness of less than 0.1 GPa, may be used. Alternatively, very hard polymers may be used, which may be more resistant to abrasion. For example, polycarbonates may have an indentation hardness ranging from about 1.2 GPa to about 3.2 GPa, and may be created by crosslinking, or by hydrogen or boron based implantation techniques.

Still referring to FIG. 1a, in a second embodiment, hard mask layer 103 is made from an initially porous material that is densified subsequently as will be described below. The hard mask layer may be in the range of about 20 nanometers to about 80 nanometers in thickness, and most preferably about 50 nanometers. The initially porous material used to form the hard mask layer may be a variety of porous silicon-based materials such as silicon nitride or silicon carbide film.

In the second embodiment, the initially porous hard mask layer 103 is formed over layer 101 which may be a sacrificial material and/or porous ILD. The hard mask layer 103 in its initially porous state may allow chemical diffusion of some or all of the thermally decomposable or sacrificial material from layer 101 therethrough to form air gap layer 105, or of a porogen therethrough to create pores in an underlying dielectric layer. Diffusion of such materials through the initially porous hard mash layer may occur at elevated temperatures, i.e., about 300 degrees C. or higher. The initially porous hard mask layer thus may act as a permeable membrane to allow diffusion of underlying thermally decomposable, sacrificial, and/or pore-creating material.

In this second embodiment, after formation of an air gap or porous dielectric layer adjacent and/or immediately under the initially porous hard mask layer 103, the initially porous material may be densified. The densification may seal most or all of the surface pores of the hard mask layer, and/or may densify a layer of the hard mask layer at or to a depth below the surface of the material. For example, silicon carbide-based films that may be used for hard mask layers may be densified at depths from about 20 nanometers to about 80 nanometers.

In accordance with the second embodiment, several alternative treatments may be used to density the initially porous material. Examples of alternative densifying treatments include use of an electron beam or ion beam, application with $N_2$ or $O_2$ plasma, another plasma with an inert gas such as argon or helium, application of ozone, radiation with ultraviolet light, or combinations of the above. However, other alternative densifying treatments also may be used.

In this second embodiment, hard mask layer 103 after densification should have a substantially increased etch resistance above its initially porous state. For example, the etch selectivity of the densified hard mask layer to carbon-doped oxide (CDO) should be significantly greater than about 3:1, and preferably greater than about 10:1. Not only should the densified hard mask layer have much greater etch resistance, but also should resist penetration or damages from liquid clean chemistries.

Still referring to FIG. 1a, in a third embodiment, hard mask layer 103 may be an initially porous material that subsequently may be treated with a pore filling material, after an underlying porous ILD or air gap has been formed. In this embodiment, any pore filling agent may be used that fills the pores with mass. The pore filling agent should effectively precipitate or attach to the sidewalls within the pores.

For example, in this third embodiment, the pore filling material may be a crosslinking agent that may be diffused into the pores of the initially porous hard mask layer. Crosslinking agents that may be used in this embodiment include, but are not limited to, silanating reagents, hexamethyl disilazane (HMDS), and disulfide crosslinking reagents. Alternatively, in The third embodiment, reagents that are used for chemical vapor deposition techniques, such as $SiH_4$ in the presence of $O_2$, may be used to fill the pores with $SiO_2$.

An example of a pore-filling material for use third embodiment is 4 mercapto-n-butyltrimethoxysilane, which may be used to seal pores in oxides by reaction of Si—$OCH_3$ with surface Si—OH groups, followed by condensation of remaining Si—$OCH_3$ groups. The thiol end cap provides a site which can be crosslinked under mild oxidation conditions that do not oxidize copper. The sulfur also provides some polarity to enhance barrier nucleation, if desired.

Another example of a pore filling material in the third embodiment is 3-methoxypropyltrimethoxysilane, which may be used to seal pores in oxides by reaction of Si—$OCH_3$ with surface Si—OH groups, followed by condensation of remaining Si—$OCH_3$ groups. Polar methoxypropyl enhances nucleation of the barrier metal layer.

In the third embodiment, crosslinking agents may be diffused sufficiently into the initially porous hard mask layer to seal at least some of the pores. Preferably, the depth of the densification should be at least half of the hard mask layer thickness of about 20 to 80 nanometers, and preferably most or all of the hard mask layer thickness.

After the hard mask layer is formed, a dual damascene or other process may be used to form one or more metal traces 102. For example, a photoresist layer may be patterned on top of hard mask layer 103 to define a via formation region, and conventional photolithographic techniques may be used, such as masking a layer of photoresist, exposing the masked layer to light, then developing the unexposed portions. Alternatives to photoresist also may be used, including a bi- or multi-layer photolithographic process, imprinting, electron beam, x-ray atomic force microscopy (AFM), or other form of advanced lithography.

Conventional process steps for etching through a dielectric layer then may be used to etch a via, e.g., a conventional anisotropic dry oxide etch process. For example, a via may be etched using a medium density magnetically enhanced reactive ion etching system (MERIE system) using fluorocarbon chemistry, or a forming gas chemistry, e.g., one including nitrogen and either hydrogen or oxygen. A trench also may be formed by lithographic and dry etch process steps.

The trench and via may be filled with conductive material to form metal traces 102. The conductive material may be copper, tungsten, aluminum, silver, gold, and their respective alloys. A CMP step may be used to remove excess conductive material and planarize the top surface of the metal traces. Optionally, a metal diffusion shunt or metal barrier layer 106 may be formed over each of the metal traces.

Figure 1B:
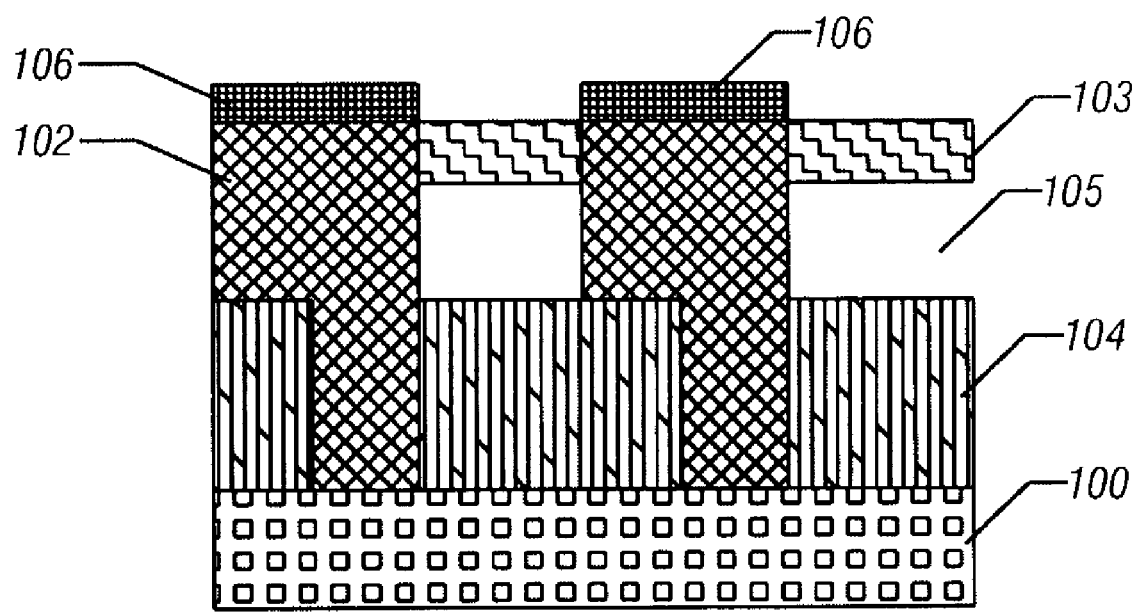

Now referring to FIG. 1b, in one embodiment, a semiconductor structure is shown in which air gap 105 has been formed by decomposition and diffusion of sacrificial material through hard mask layer 103. For example, the sacrificial material may be decomposed and diffused at a temperature of at least about 300 degrees C. Thus, the air gap may be formed adjacent to and/or immediately under the hard mask layer.

Still referring to FIG. 1b, in another embodiment, layer 105 may be a low-k dielectric material formed by decomposition and diffusion of porogens or other pore forming material through the hard mask layer. As discussed above, to enable formation of a low-k dielectric layer 105 adjacent and/or immediately under the hard mask layer, the pore-forming material may be diffused through hard mask layer 103.

Still referring to FIG. 1b, the initially porous hard mask layer 103 (i.e., the second and third embodiments may be densified after removal of some or all of the material in layer 101, including thermally decomposable material, sacrificial material, or pore forming agents. Densification of the hard mask then may be accomplished by electron beam or ion beam, $N_2$ or $O_2$ plasma modification, another plasma with an inert gas such as argon or helium ozone, ultraviolet light, combinations of the foregoing, or by filling the pores with a mass.

Figure 1C:
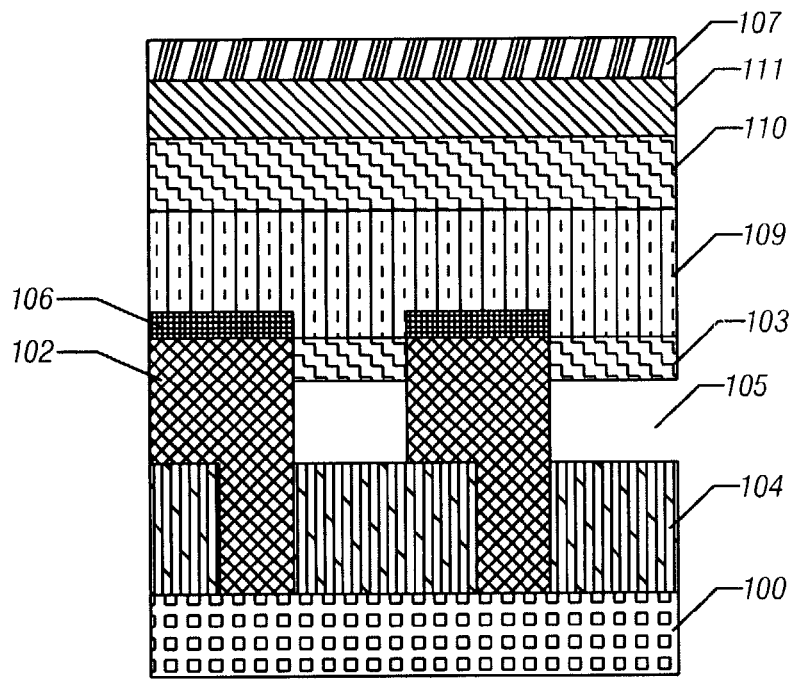

Now referring to FIG. 1c, a semiconductor structure is shown including dielectric layer 109, layer 110, hard mask layer 111, and sacrificial patterning layer 107, Dielectric layer 109 may be the same or a similar low-k dielectric material as dielectric layer 104. Layer 110 may be the same or similar to layer 101, i.e, a thermally decomposable and/or sacrificial material, or a dielectric material containing a pore-forming agent. Hard mask layer 111 may be the same or similar material as hard mask layer 103, such as a polymeric material or an initially porous material that may later be densified.

Figure 1D:
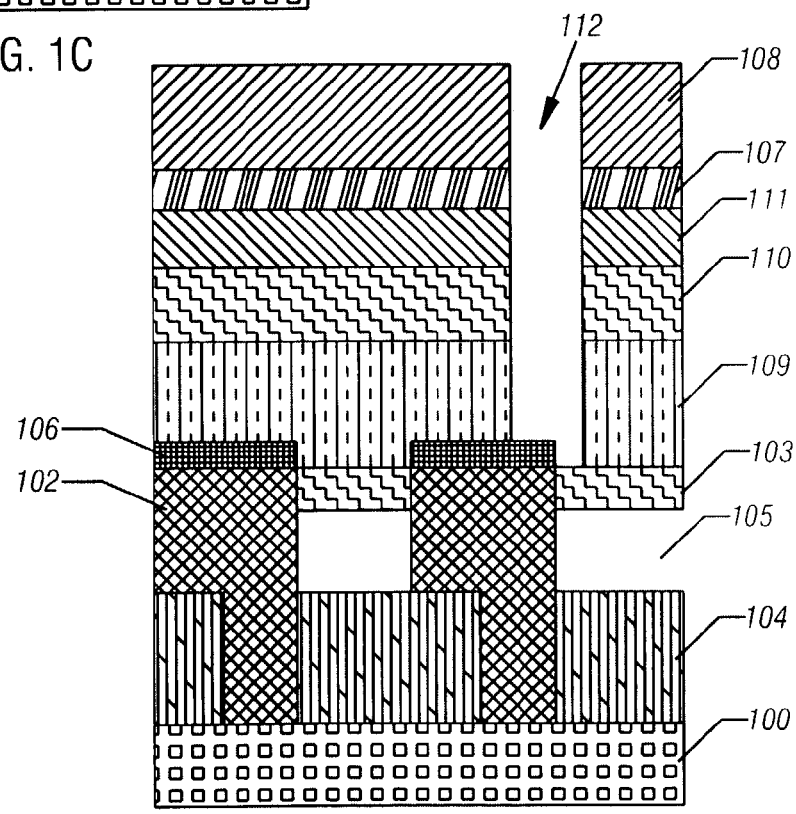

Now referring to FIG. 1d, in one embodiment, photoresist layer 108 may be patterned to define a via region and a dry etching process may be performed to form via 112. The via may extend through and penetrate multiple layers on the substrate until reaching and abutting hard mask layer 103. Via 112 is shown as an unlanded via, i.e., a portion of the via is offset from metal trace 102. The etching process to form via 112 may abut but should not penetrate the hard mask layer 103 which may be a polymeric or a densified material. The etch selectivity of the polymeric or densified material in relation to the dielectric layer 109 should be greater than about 3:1 and more preferably greater than about 10:1.

Figure 1E:
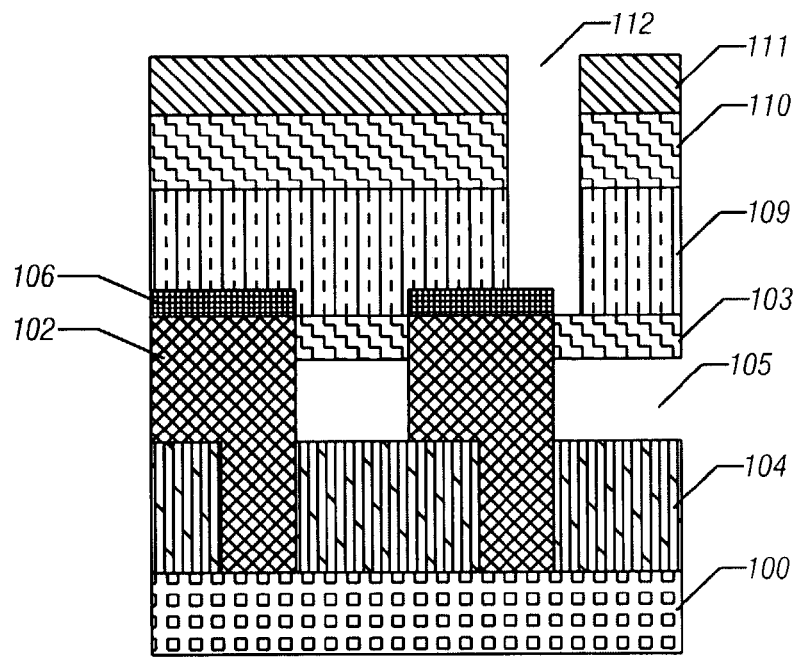

In FIG. 1e, the resulting structure is shown after cleaning of etch residue, and removal of patterning layer 107 and photoresist 108. The hard mask layer 103 preferably is resistant to the cleaning chemistry used for the cleaning and removal processes used in conjunction with the formation a via in a dual damascene process.

Figure 1F:
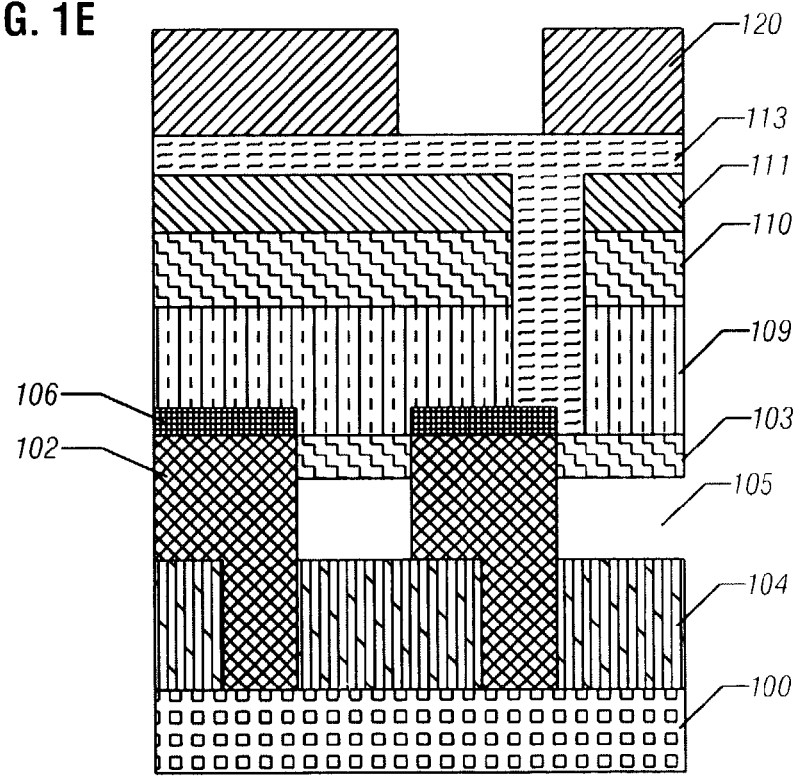

FIG. 1f shows a semiconductor structure in one embodiment in which sacrificial material 113 fills the via region and covers hard mask layer 111. Additionally, photoresist 120 may be patterned to define a trench region.

Figure 1G:
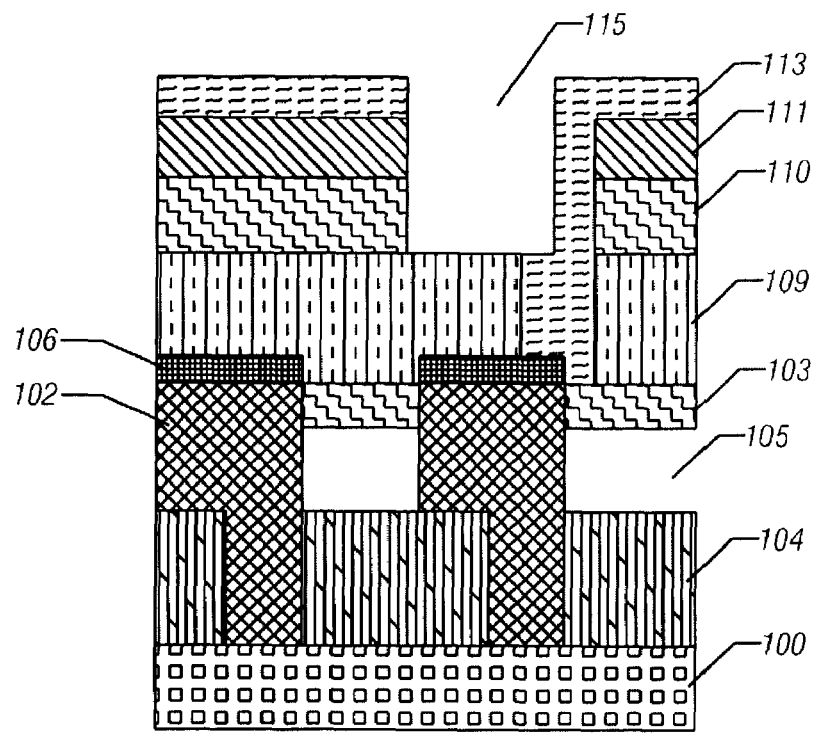

FIG. 1g shows a semiconductor structure according to one embodiment in which trench region 115 has been etched through hard mask layer 111 and layer 110. In another embodiment, some or all of the photoresist may remain after the trench etch.

Figure 1H:
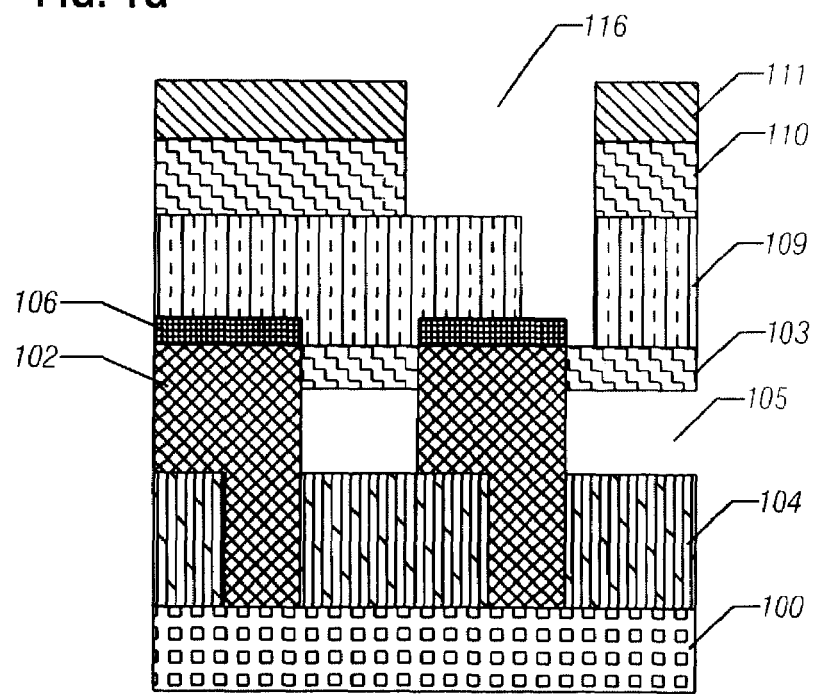

FIG. 1h shows the structure after sacrificial material 113 has been removed and etch residue has been cleaned from opening 116. Remaining photoresist also maybe removed or cleaned out with the sacrificial material. The polymeric or densified hard mask layer 103 provides a stop to block etch and/or cleaning chemistries from reaching larger 105 which may be an air gap or low k dielectric material.

Figure 1I:
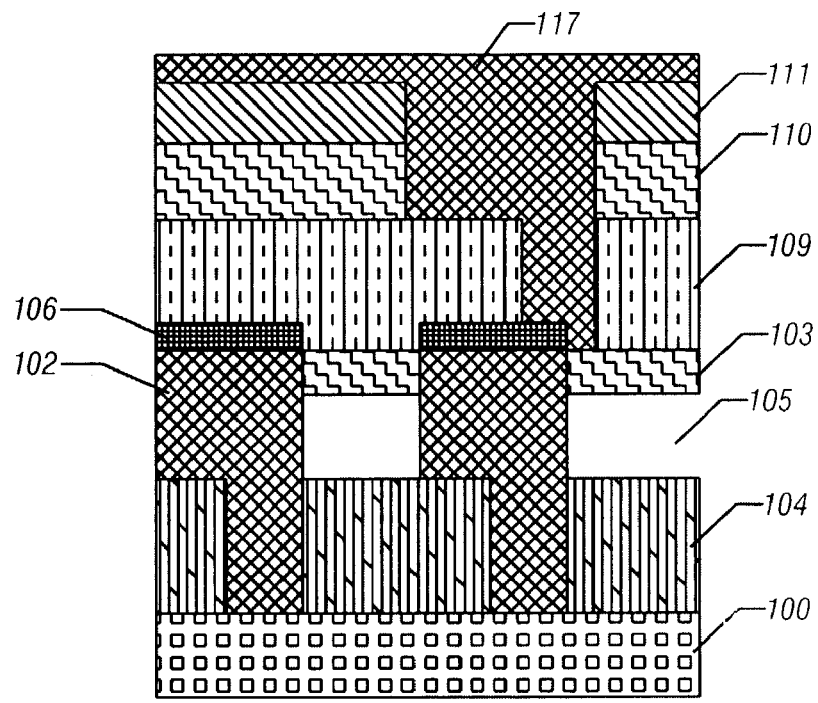

Now referring to FIG. 1i, a semiconductor structure is shown according to an embodiment of the invention in which copper, tungsten or other conductive metal forms metal trace 117. The metal trace may abut but not substantially penetrate hard mask layer 103, thus preventing the metal from reaching or entering layer 105. Chemical mechanical polishing (CMP) may be used to planarize the top surface of the metal trace 117.

Figure 1J:
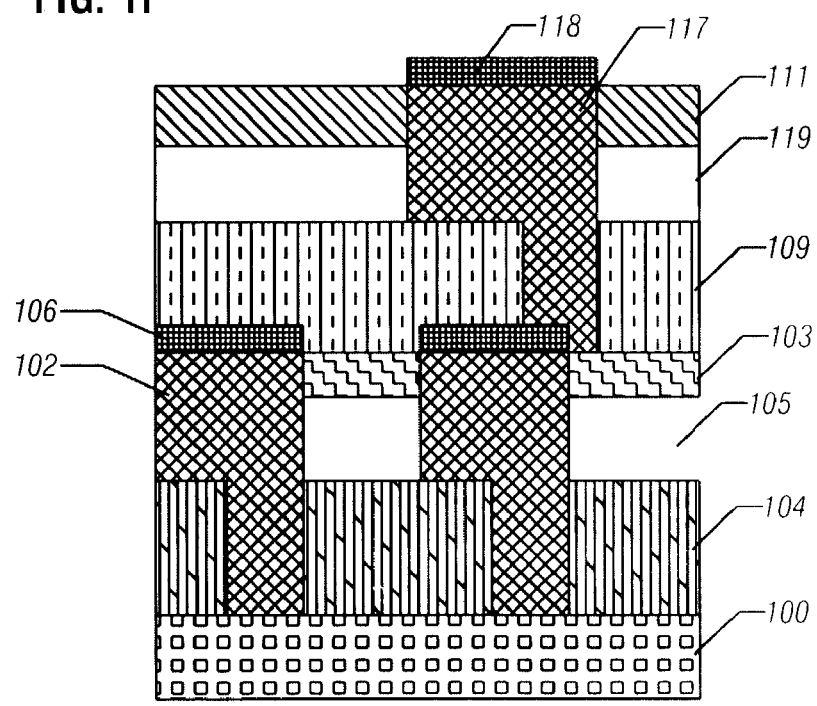

FIG. 1j shows a resulting structure according to one embodiment after air gap or low-k dielectric layer 119 is formed adjacent and/or immediately under hard mask layer 111. The air gap or low-k ILD may be formed by diffusion of sacrificial material or pore-forming agents through the hard mask layer 111. Optionally, a metal diffusion shunt 118 also may be formed over metal trace 117.

In one embodiment, if hard mask layer 111 is formed of an initially porous material, it then may be densified after formation of air gap or low-k dielectric layer 119. For example, densification of hard mask layer 111 may be accomplished through the same or similar treatments used to densify hard mask layer 103.

As shown in FIG. 1j, hard mask layer 103 provides mechanical support to build multiple layers on top of it. The hard mask may be less than about 80 nanometers in thickness, and most preferably about 50 nanometers or less. The hard mask is thin enough and has enough free volume to allow diffusion of sacrificial material or pore-forming agents through it. Additionally, the hard mask is rigid enough to maintain its shape between the metal lines after the sacrificial material is removed and an air gap or porous dielectric layer is formed under the hard mask.

In one embodiment, the polymer or densified hard mask provides an etch stop that prevents an unlanded via from breaking into an air gap or ILD below the via. The polymer or densified hard mask provides enough etch selectivity to via etch and sacrificial material removal steps to isolate the air gap or porous dielectric. Additionally, the k value of the hard mask is sufficiently low to help minimize the overall $k_{eff}$ of the dielectric stack.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a hard mask layer over a layer of at least partially thermally decomposable material on a substrate, said hard mask layer to contact said at least partially thermally decomposable material;
   diffusing at least some of the at least partially thermally decomposable material through the hard mask layer; and
   forming an unlanded conductive element, a bottom end of said conductive element to abut a topmost surface of the hard mask layer without substantially penetrating the hard mask layer.

2. The method of claim 1 further comprising forming an unlanded via with a dual damascene process.

3. The method of claim 1 further comprising forming an air gap under the hard mask layer.

4. The method of claim 1 further comprising forming a porous dielectric region under the hard mask layer.

5. The method of claim 1 wherein the at least partially thermally decomposable material comprises a pore-forming agent.

6. The method of claim 1 wherein forming a hard mask layer includes forming an organic polymeric hard mask layer selected from the group consisting of polycarbonate, polysulfide, and polyetheretherketone.

7. The method of claim 1 wherein forming a hard mask layer includes one of forming said hard mask layer of polynorbornene and forming another polynorbornene hard mask layer, said polynorbornene hard mask layer having an indentation hardness of less than about 0.1 GPa.

8. The method of claim 1 wherein forming a hard mask layer includes one of forming said hard mask layer of an organic polymer and forming an organic polymeric hard mask layer, said organic polymeric hard mask layer having an indentation hardness ranging from about 1.2 GPa to about 3.2 GPa.

9. The method of claim 1 wherein forming a hard mask layer includes one of forming said hard mask layer of an organic polymer and forming an organic polymeric hard mask layer, said organic polymeric hard mask layer having a thickness ranging from about 20 nanometers to about 80 nanometers.

10. The method of claim 1 including forming a dielectric layer over said hard mask layer, said hard mask layer having a high etch selectivity compared to the dielectric.

11. The method of claim 1 including thermally decomposing said at least partially thermally decomposable material at a temperature of about 300° C.

12. A method comprising:
forming a layer of sacrificial material on a semiconductor substrate;
forming an initially porous hard mask layer over the layer of sacrificial material;
etching said initially porous hard mask layer before the layer of sacrificial material to form an opening for an unlanded conductive element;
removing at least some of said sacrificial material to form an air gap under the initially porous hard mask layer; and
densifying the initially porous hard mask layer.

13. The method of claim 12 wherein densifying the initially porous hard mask layer comprises treatment of the initially porous hard mask layer with an electron beam.

14. The method of claim 12 wherein densifying the initially porous hard mask layer comprises treatment of the initially porous hard mask layer with an ion beam.

15. The method of claim 12 wherein densifying the initially porous hard mask layer comprises treatment of the initially porous hard mask layer with a nitrogen plasma.

16. The method of claim 12 wherein densifying the initially porous hard mask layer comprises treatment of the initially porous hard mask layer with an oxygen plasma.

17. The method of claim 12 wherein densifying the initially porous hard mask layer comprises treatment of the initially porous hard mask layer with a plasma with an inert gas.

18. The method of claim 12 wherein densifying the initially porous hard mask layer comprises treatment of the initially porous hard mask layer with an ozone.

19. The method of claim 12 wherein densifying the initially porous hard mask layer comprises treatment of the initially porous hard mask layer with ultraviolet light.

20. The method of claim 12 wherein densifying the initially porous hard mask layer comprises treatment of the initially porous hard mask layer with a crosslinking agent to fill at least some of the pores.

21. A method comprising:
forming a porous hard mask layer over a sacrificial layer;
filling an opening in said porous hard mask layer and said sacrificial layer with a conductive material;
while said opening is filled with said conductive material, removing at least a portion of said sacrificial material to form an air gap under said hard mask; and
densifying said porous hard mask over said air gap.

22. The method of claim 21 wherein forming a porous hard mask layer over a sacrificial layer includes forming a porous hard mask layer that contacts said sacrificial layer, without an intervening layer that is not densified.

23. The method of claim 21 wherein filling an opening includes filling an unlanded conductive element, a bottom end of said unlanded conductive element to abut a topmost surface of an underlying, densified hard mask layer.

24. The method of claim 23 wherein filling an opening includes filling an unlanded conductive element, the bottom end of the unlanded conductive element to abut a topmost surface of an underlying, densified hard mask layer without substantially penetrating the hard mask layer.

25. The method of claim 21 including filling said opening with another sacrificial material before filling said opening with said conductive material.

26. The method of claim 25 including forming another opening, said another opening formed in said sacrificial material, said another sacrificial material, and said porous hard mask layer, removing said another sacrificial material, and then filling both said opening and said another opening with said conductive material.

* * * * *

UNITED STATES PATENT AND TRADEMARK OFFICE
CERTIFICATE OF CORRECTION

PATENT NO. : 7,238,604 B2 Page 1 of 1
APPLICATION NO. : 10/422432
DATED : July 3, 2007
INVENTOR(S) : Grant M. Kloster et al.

It is certified that error appears in the above-identified patent and that said Letters Patent is hereby corrected as shown below:

Column 8: Claim 7
Line 62, "polynorbomene" should be --polynorbornene--.

Signed and Sealed this

Eleventh Day of September, 2007

JON W. DUDAS
*Director of the United States Patent and Trademark Office*